United States Patent [19]

Read et al.

[11] Patent Number: 5,580,203
[45] Date of Patent: Dec. 3, 1996

[54] RESILIENT SNAP FITTING RETAINER FOR PRINTED CIRCUIT BOARD MOUNTING OR THE LIKE

[75] Inventors: J. Michael Read; Thomas J. Neillo, both of San Diego, Calif.

[73] Assignee: General Instrument Corporation of Delaware, Chicago, Ill.

[21] Appl. No.: 360,270

[22] Filed: Dec. 21, 1994

[51] Int. Cl.$^6$ .................................................. F16B 19/00
[52] U.S. Cl. ........................................... 411/508; 411/510
[58] Field of Search ..................... 411/508, 510, 411/907, 908, 2, 9, 493, 495–497, 509, 913, 39, 42

[56] References Cited

U.S. PATENT DOCUMENTS

| | | | |
|---|---|---|---|
| 2,984,698 | 5/1961 | Strauss | 411/510 |
| 2,995,328 | 8/1961 | Whitted | 411/907 |
| 3,120,971 | 2/1964 | Bengtsson | 411/907 |
| 3,139,768 | 7/1964 | Biesecker | 411/508 |
| 3,485,133 | 12/1969 | Rapata | 411/508 |
| 3,550,217 | 12/1970 | Collyer | 411/509 |
| 3,756,115 | 9/1973 | Schuplin | 411/508 |
| 4,470,737 | 9/1984 | Wollar | 411/508 |
| 4,927,309 | 5/1990 | Sygnator | 411/493 |

FOREIGN PATENT DOCUMENTS 1207235  9/1970  United Kingdom ................. 411/495

*Primary Examiner*—Steven N. Meyers
*Assistant Examiner*—Gary Estremsky
*Attorney, Agent, or Firm*—Barry R. Lipsitz; Ralph F. Hoppin

[57] ABSTRACT

A resilient snap fitting retainer provides a desired retention force despite tolerance variations. A pair of parallel resilient legs extends from a base. The legs are separated by a gap. A deformable rib is provided on at least one of the legs to partially crush when the legs are compressed with sufficient force. The partial crushing compensates for tolerance variations in the size of an opening into which the retainer is inserted or in the size of the retainer itself. The legs are elongated and terminate in wedge shaped feet at their distal end. The feet form a generally arrowhead-like shape for insertion into an opening. The structure of the feet and legs enables the legs to deflect toward each other (i.e., buckle) after the interior surfaces of the legs have made contact at their distal ends as the feet are pushed through the opening.

18 Claims, 3 Drawing Sheets

5,580,203

RESILIENT SNAP FITTING RETAINER FOR PRINTED CIRCUIT BOARD MOUNTING OR THE LIKE

BACKGROUND OF THE INVENTION

The present invention relates to a retainer for mounting components to a substrate, and more particularly to a resilient retainer for snap fitting into a hole on a printed circuit board or the like.

Snap fitting retainers for mounting components on printed circuit boards and other planar substrates are well known. One type of such retainers comprises a set of bifurcated legs, each terminating in a wedge having a narrow forward portion for insertion into a hole and a broad shoulder portion that snaps over the hole for retention.

A problem with prior art retainers of this type is that they are prone to pop back out of the hole into which they have been inserted upon application of a rather nominal force in the direction opposite from the installation direction. This problem is exacerbated by the fact that manufacturing tolerances cause the holes into which the retainers are inserted to be different sizes, even though they are supposed to be the same. Similarly, the retainers themselves are subject to manufacturing tolerances that cause dimensional variations. This has required the retainers to be glued to the substrate (e.g., printed circuit board) after assembly, an extra step requiring increased labor and materials and adversely affecting the finished cost of a product utilizing such retainers. Where such a gluing step is skipped, the reliability of finished products may be adversely affected by retainers which release in the field.

It would be advantageous to provide a resilient, snap fitting retainer that provides a desired retention force despite tolerance variations in an opening into which the retainer snaps. Such a retainer should also withstand tolerance variations in the manufacturing of the retainer itself. Advantageously, such an improved retainer would partially deform to various degrees during insertion, depending on the exact dimensions of the retainer itself and the hole to which it is mounted, thereby effectively causing the retainer to resize itself during assembly.

The present invention provides a resilient, snap fitting retainer having the aforementioned and other advantages.

SUMMARY OF THE INVENTION

In accordance with the present invention, a resilient snap fitting retainer provides a desired retention force despite tolerance variations in at least one of the retainer and an opening into which the retainer snaps. The retainer comprises a pair of generally parallel resilient legs extending from a base. Each leg has an interior surface facing the interior surface of the other leg, with a gap therebetween to allow compression of the legs toward each other. A deformable rib runs longitudinally along the interior surface at the distal end of at least one of the legs for contacting the corresponding interior surface of the other leg. The deformable rib is partially crushed when the legs are compressed with sufficient force. The amount of crushing of the rib is dependent on the amount of force applied thereto when contacted by the other leg. The partial crushing allows the retainer to accommodate openings having different sizes due to tolerance variations.

In a preferred embodiment, each of the legs has a deformable rib at its distal end running longitudinally along the interior surface thereof. The ribs are preferably aligned with each other for engagement when the legs are compressed. The material from which the retainer is made, for example glass filled nylon, can be such that the crushing of the rib is permanent.

Each of the legs can terminate in a wedge shaped foot at its distal end. In an illustrated embodiment, the feet together form a generally arrowhead-like shape bifurcated by the gap and having a point at one end thereof and a shoulder at the opposite end thereof. The point and shoulder are connected by outwardly sloping walls adapted for insertion through said opening, with said point being inserted first ("point-first"). The shoulder is arranged to snap over the opening when pushed therebeyond to retain the retainer in the opening. The feet and legs are constructed and arranged to enable the legs to deflect toward each other in an area between the base and the shoulder after the interior surfaces of the legs have made contact at their distal ends as the feet are pushed through the opening.

The outwardly sloping walls can extend at a first slope to establish a first applied force prior to a time at which the interior surfaces of the legs make contact with each other, as the feet are pushed through the opening. The outwardly sloping walls can extend at a second slope to establish a second applied force after the interior surfaces of the legs make contact, and while the legs are deflecting toward each other in the area between the base and shoulder as the feet continue to be pushed through the opening. More particularly, the first slope can comprise an angle in a range of about 12° to 20° with respect to a longitudinal axis of the retainer and the second slope can comprise an angle in a range of about 6° to 12° with respect to the longitudinal axis of the retainer. In an illustrated embodiment, the distance from the shoulder to the point of the arrowhead-like shape is approximately equal to the distance from the base of the retainer to the shoulder of the arrowhead-like shape.

In a more specific embodiment, the outwardly sloping walls extend at a first slope commencing at the point of the arrowhead-like shape to facilitate the initial insertion of the retainer into an opening. The outwardly sloping walls extend at a second slope to establish a first applied force prior to a time at which the interior surfaces of the legs make contact as the feet are pushed through the opening. The second slope follows the first slope and is different than the first slope. The outwardly sloping walls extend at a third slope to establish a second applied force after the interior surfaces make contact and while the legs are deflecting toward each other in the area between the base and shoulder as the feet continue to be pushed through the opening. The third slope follows the second slope and is different than the second slope.

The inventive structure is such that the retainer can comprise both the crushable ribs and the unique feet which enable the legs to deflect toward each other between the base and shoulder. Alternatively, some tolerance variations can be accommodated by providing a retainer with only the crushable ribs. Still further, the advantages of the invention can be at least partially achieved by providing a structure without the ribs, and with the unique feet and leg structure that enables the legs to deflect in the area between the base and shoulder after the interior surfaces of the legs have made contact at their distal ends as the feet are pushed through the opening.

DETAILED DESCRIPTION OF THE INVENTION

Figure 1:
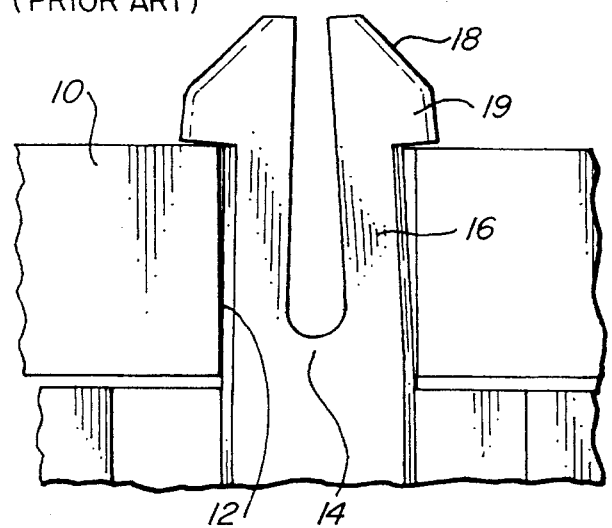
FIG. 1 is a diagrammatic side view of a prior art retainer inserted into an opening of a substrate.
Figure 4:
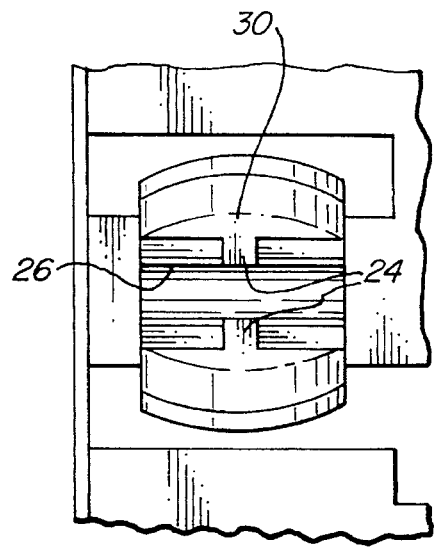
FIG. 4 is a top plan view of the retainer of FIG. 2 extending from an object to be mounted.

FIG. 1 illustrates a prior art retainer 14 inserted into the opening 12 of a substrate 10. The substrate can comprise, for example, a printed circuit board and the retainer 14 can extend from a component to be mounted (not shown) such as a telephone jack, transformer, relay, or the like.

The retainer 14 includes two legs 16 which terminate in wedge shaped feet 18. The tips 19 of the feet 18 extend slightly over the opening 12 to provide the retention function. A problem with the prior art design illustrated in FIG. 1 is that due to tolerance variations in the retainer itself or in the opening 12, the tips 19 may not extend sufficiently over the edges of the opening in order to provide the required retention force. From testing, it has been determined that the proper retention force required to mount a telephone modem connector, for example, to a printed circuit board is obtained only if the span across the wedge shaped feet 18 is a minimum of 0.003 inches larger than the hole 12, after insertion of the retainer and in a compressed state. This foot to hole overlap condition must be maintained while accommodating the manufacturing tolerance of the hole and retainer, which may each be, for example, on the order of 0.004 inches. Worst case tolerance samples of prior art devices either deformed to a failure mode or fell out during insertion into the printed circuit board.

Figure 2:
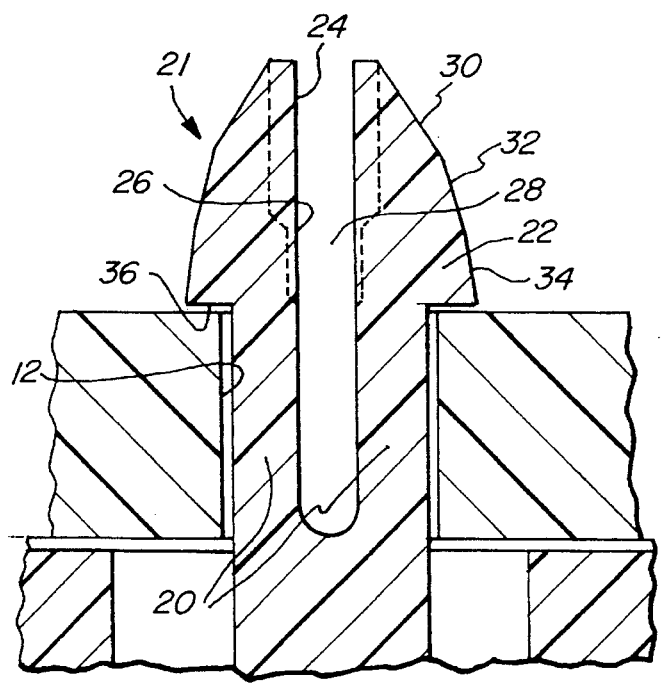
FIG. 2 is a cross-sectional view of a retainer in accordance with the present invention fully inserted into a substrate opening.
Figure 3:
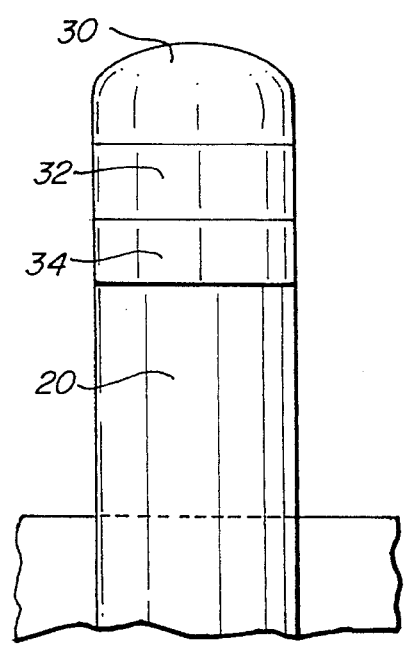
FIG. 3 is a side plan view of the retainer illustrated in FIG. 2.

The present invention overcomes the problems of the prior art by providing two unique features illustrated, for example, in FIG. 2. The first feature is a thin "crush rib" 24 that partially deforms to varying degrees during insertion of the retainer 21 into hole 12, depending on the exact dimensions of the retainer and the hole being mated. The crush ribs 24 deform more for larger feet and/or for smaller holes. This feature effectively eliminates a portion of the required tolerance since the wedge shaped feet 22 of the retainer 21 are allowed to resize themselves during assembly.

The second feature of the present invention is a reshaping of the wedge shaped feet 22, in order to change the way that the legs 20 deform due to forces created during insertion into the substrate opening. More particularly, the foot is lengthened as compared to the prior art to the point that the product of the new length and the normal force of the walls of the substrate opening against the foot during insertion creates a bending moment sufficient to elastically deflect the portion of the leg near the widest part (i.e., shoulder 36) of the foot. This elastic deflection narrows the gap 28 near the shoulder 36 of the retainer as it is being inserted into the opening 12.

Figure 6:
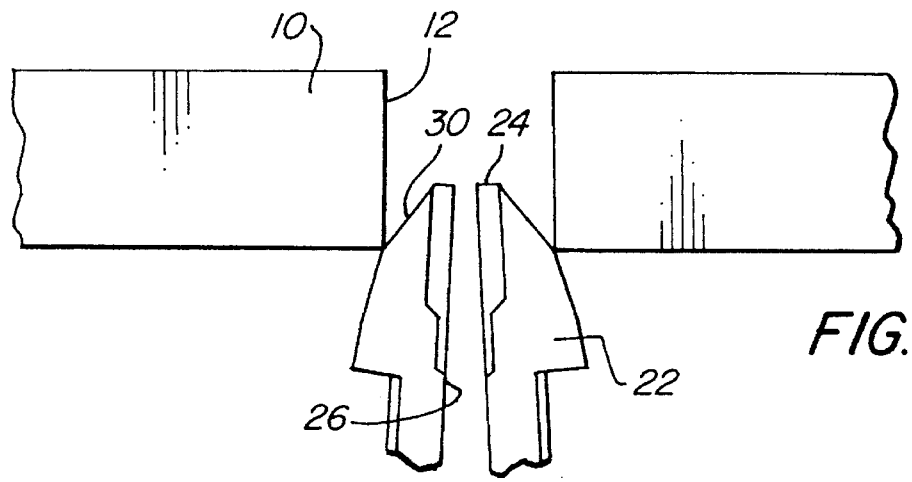
FIG. 6 is a diagrammatic illustration showing the initial insertion of the retainer into an opening in a substrate.
Figure 5:
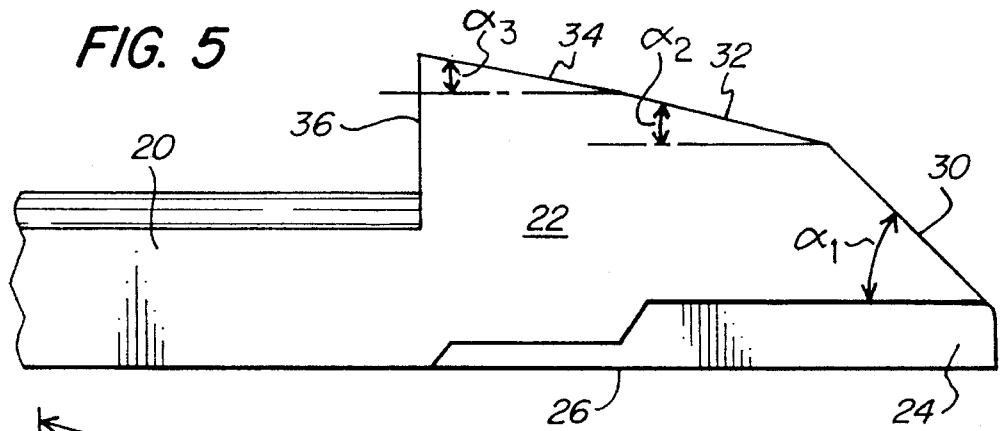
FIG. 5 is an enlarged front plan view of a wedge shaped foot, and portion of the leg from which it extends, used on the retainer of the present invention.

The feet 22 of the present invention also contain varying slopes, as best illustrated in FIG. 5. A first slope 30 is provided at an angle ($\alpha_1$) to facilitate the initial insertion of the retainer into the opening 12 of the substrate 10. This angle is preferably on the order of 40° to 60°. The engagement of the first slope with the opening 12 as the retainer is inserted into the substrate 10 is illustrated in FIG. 6.

Figure 7:
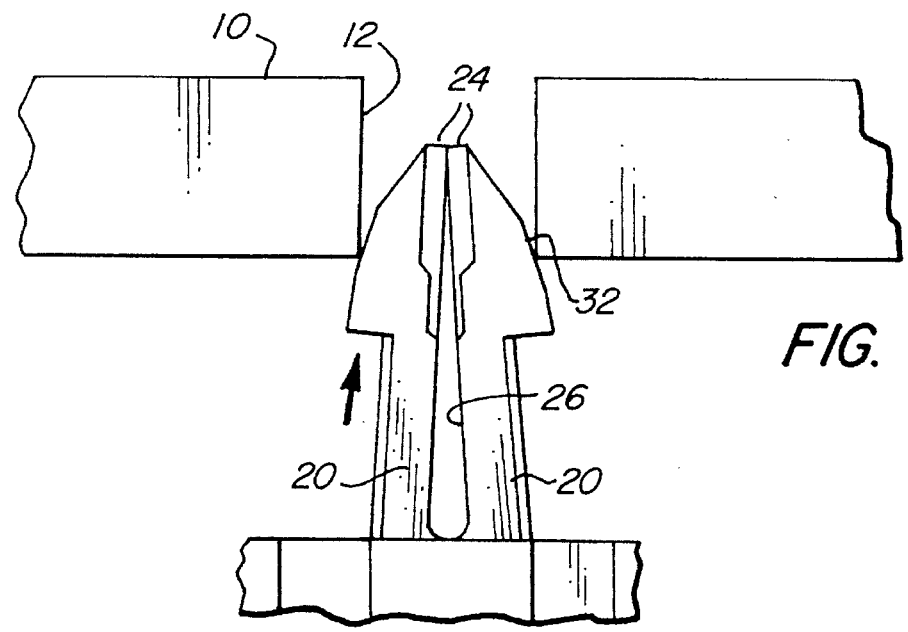
FIG. 7 is a diagrammatic illustration showing the progression of the retainer into the substrate opening.

FIG. 7 illustrates the further insertion of the retainer to the point at which the interior surfaces 26 of the legs make contact via crush ribs 24 at the distal ends of legs 20. A second slope 32 which follows first slope 30 at a different angle ($\alpha_2$) establishes a first applied force from the inside wall of opening 12 prior to the time at which the interior surfaces 26 of the legs make contact as the feet are pushed through the opening. The angle $\alpha_2$ can be, for example, on the order of 12° to 20°.

A third slope 34 follows slope 32 at yet another angle ($\alpha_3$). The third slope 34 establishes a second applied force from the inside wall of opening 12 after the interior surfaces 26 make contact via ribs 24 and while the legs are deflecting toward each other in the area 40 between the base 23 and the shoulder 36 of the retainer, as the feet continue to be pushed through the opening 12. The angle $\alpha_3$ is preferably in a range of about 6° to 12°.

Figure 10:
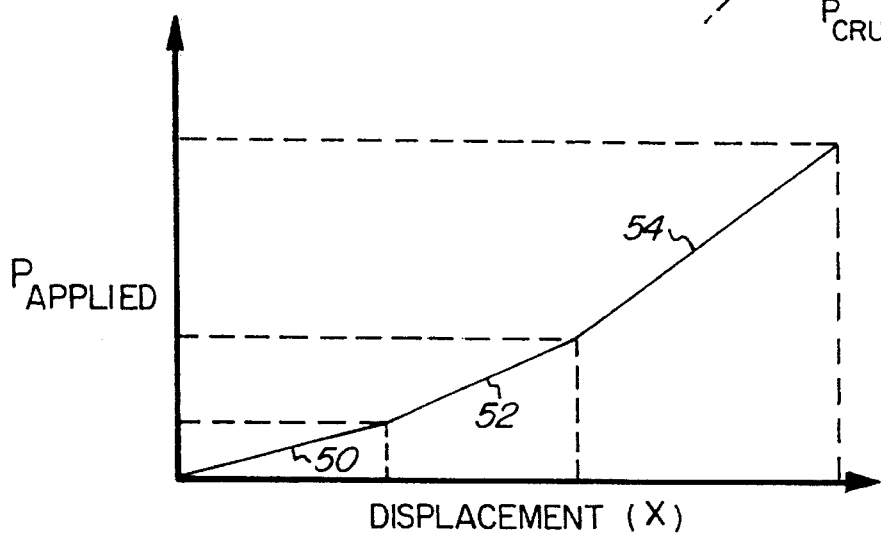
FIG. 10 is a graph of the force applied to the retainer by the edges of a substrate opening as a function of the displacement under the applied force.

A goal of the slopes 32 and 34 is to minimize the insertion force of the retainer by decreasing the slope as the value of the applied force ($P_{applied}$) increases during insertion. FIG. 10 illustrates, in graphical form, the force applied to the foot portions 22 of the retainer as a function of the displacement of the retainer into the substrate opening. The slope 50 in FIG. 10 illustrates the initial force imparted by the edges of opening 12 as the retainer is inserted into the opening along slope 30. The slope 52 of FIG. 10 illustrates the force imparted along the slope 32 of the retainer. The slope 54 of FIG. 10 illustrates the force imparted as the retainer is pushed into the opening along slope 34.

Figure 8:
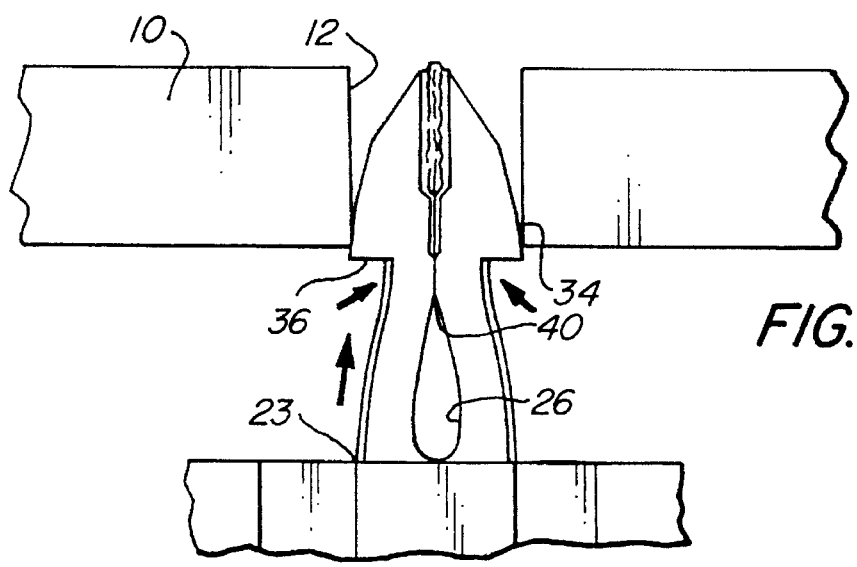
FIG. 8 is a diagrammatic illustration showing a further progression of the retainer into the substrate opening.

The shape of slope 34 on the retainer provides a more glancing angle than the prior art, so that the normal force of the circumferential wall of the substrate opening against the foot during insertion is in a more perpendicular direction. This increases the bending moment that displaces the legs toward each other in the area 40 illustrated in FIG. 8. An additional benefit of the redirection of the normal force is the reduction in the overall force it takes to install the retainer into the substrate opening. Since the retention force provided by shoulder 36 overlapping the edge of the substrate opening 12 (as shown in FIG. 2) acts in a parallel direction, it cannot create a bending moment large enough to cause the legs to deflect as shown in FIG. 8. Thus, the retainer does not easily release from the opening while being pulled on after installation in a direction opposite to the insertion direction. The structure of the foot in accordance with the present invention effectively turns the retainer into an elastic spring, which is elastic to compressive radial loading (such as the normal force from the substrate opening during insertion) but is insensitive to axial loading (as required for retention).

Figure 9:
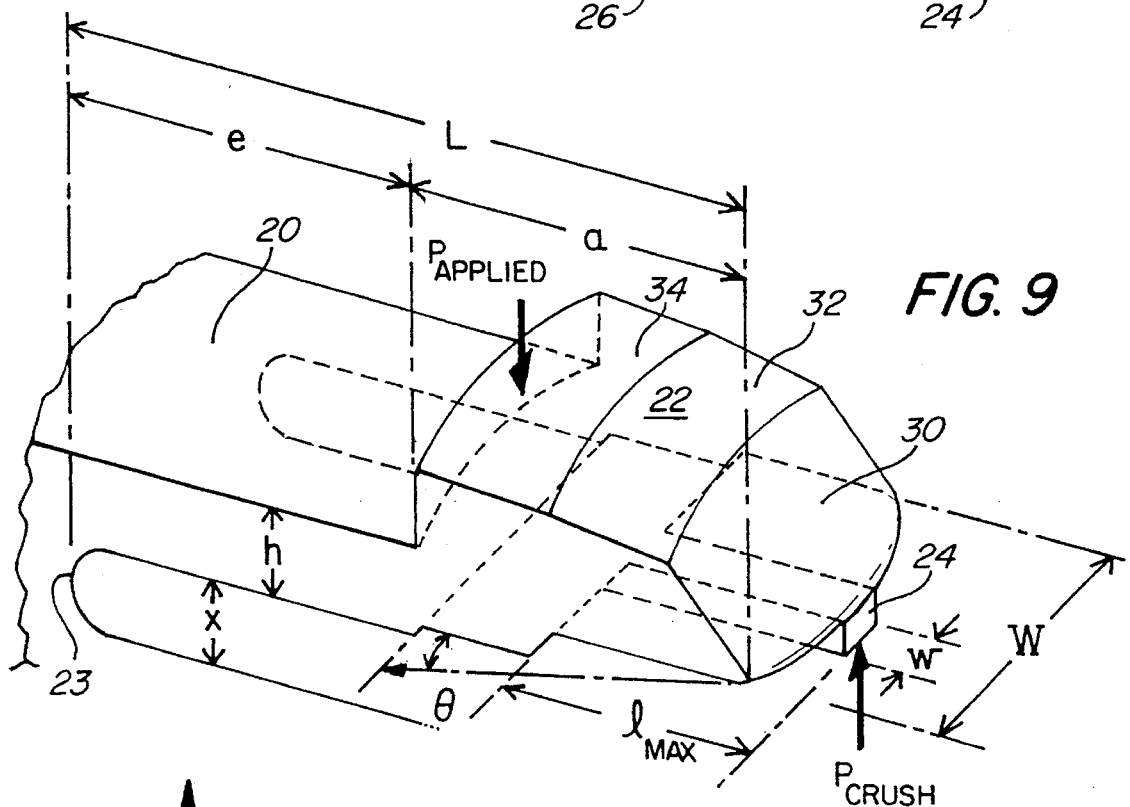
FIG. 9 is an enlarged partial view of a retainer in accordance with the present invention illustrating various dimensions thereof.

FIG. 9 illustrates the dimensions of the leg 20 and foot 22 of a retainer in accordance with the present invention. Also illustrated is the crush rib 24, which is optional. The spring rate for the retainer after the tips of the feet contact consists of two parts. These involve the crushing of the deformable rib 24 (when provided) and elastic deformation of the leg in the area 40 illustrated in FIG. 8. For the deformable rib, the rate of plastic deformation of the rib at the point where $P_{crush}$ is applied is calculated as follows:

$$\sigma_{yield} = \frac{P_{crush}}{l*w} \text{ and } l = \frac{\text{deformation}}{\tan\theta},$$

where "l" is the actual length over which the crush occurs, which will be something less than $l_{max}$ shown in FIG. 9 and "deformation" is the amount the rib deforms in height.

Combining and rearranging:

$$K_{crush}(\text{with respect to } P_{crush}) = \frac{P_{crush}}{\text{deformation}} = \frac{w*\sigma_{yield}}{\tan\theta}.$$

Further, to convert from the point of view of $P_{crush}$ to $P_{applied}$: $P_{applied} = T*P_{crush}$, where T is a constant derived from the geometry of the foot.

Thus, from the point of view of the applied load:

$$K_{crush} = \frac{T*w*\sigma_{yield}}{\tan\theta}$$

Since the legs are still elastically bending in a cantilevered manner from the base 23 as the deformable rib(s) 24 is crushing, the overall spring rate $K_1$ is: $K_1 = K_{crush} + K_{bend}$, where $K_{bend}$ is the spring rate of the cantilevered leg, the derivation of which is well known.

In order to compute the total equivalent spring rate for both plastic deformation (i.e., the crushing of the deformable rib(s)) and elastic deformation (i.e., the mid-span deflection of the legs in area 40), the mid-span deflection $K_2$ must also be determined. The approximate mid-span deflection is determined from the relationship:

$$K_2 = \frac{P_{applied}}{\text{deformation}} = \frac{E*W*h^3*L^3}{a^2*e^3*(3L+a)},$$

where "E" is Young's modulus (i.e., the modulus of elasticity) and "deformation" is the amount of deformation directly under the application of the load, i.e., under $P_{applied}$. The total equivalent spring rate $K_{total}$ is then:

$$K_{total} = \frac{K_1 K_2}{K_1 + K_2}.$$

It should now be appreciated that the present invention provides a resilient snap fitting retainer that can be successfully mated with an opening in a substrate over a wide tolerance range while maintaining the necessary retention force. A crush rib allows larger retainer feet to partially resize themselves to smaller holes. Typically, the crush rib can accommodate about 35 percent of any needed tolerance. The elastic nature of the elongated legs and feet absorb the balance (e.g., up to about 65 percent) of the needed tolerance.

A further advantage of the invention is that material on the exterior surface of the wedge shaped feet will not be shaved off of the retainer as it is installed into the substrate opening. Prior art devices typically resulted in the shearing of the external surface of the feet if the retainer was too big for the hole. This can make it very difficult, if not impossible, to fully insert the retainer into the hole. In the structure of the present invention, instead of the insertion force causing shearing of the surface material, the gap between the legs narrows due to the mid-span bending in order to prevent shearing. More particularly, once the tips of the feet touch, the insertion force causes mid-span bending due to the extended length of the legs, while the crush ribs simultaneously deform to accommodate a tight fit. The insertion force is kept relatively constant by the gradual slope of the feet during this process.

Although the invention has been described in connection with various preferred embodiments, those skilled in the art will appreciate that numerous adaptations and modifications may be made thereto without departing from the spirit and scope of the invention as set forth in the claims.

We claim:

1. A resilient snap fitting retainer for providing a desired retention force despite tolerance variations in at least one of the retainer and an opening into which the retainer snaps, comprising:

a pair of generally parallel resilient legs extending from a base, each leg having an interior surface facing the interior surface of the other leg with a gap therebetween to allow compression of the legs toward each other; and a deformable rib running longitudinally along the interior surface at the distal end of at least one of said legs and not connected to the other leg for contacting the corresponding interior surface of the other leg and partially crushing when the legs are compressed with sufficient force;

wherein the amount of crushing of said rib is dependent on the amount of force applied thereto when contacted by the other leg, said partial crushing allowing said retainer to compensate for said tolerance variations.

2. A retainer in accordance with claim 1 wherein each of said legs has a deformable rib at its distal end running longitudinally along the interior surface thereof.

3. A retainer in accordance with claim 2 wherein said ribs are aligned with each other for engagement when said legs are compressed.

4. A retainer in accordance with claim 1 wherein the crushing of said rib is permanent.

5. A retainer in accordance with claim 1 wherein:

each of said legs terminates in a wedge shaped foot at its distal end, said feet together forming a generally arrowhead-like shape bifurcated by said gap and having a point at one end thereof and a shoulder at the opposite end thereof, said point and shoulder being connected by outwardly sloping walls adapted for insertion point-first through said opening, said shoulder being arranged to snap over said opening when pushed therebeyond to retain said retainer in said opening; and said feet and legs are constructed and arranged to enable said legs to deflect toward each other in an area between said base and said shoulder after the interior surfaces of said legs have made contact at their distal ends as said feet are pushed through said opening.

6. A retainer in accordance with claim 5 wherein:

said outwardly sloping walls extend at a first slope to establish a first applied force prior to a time at which said interior surfaces of said legs make contact as said feet are pushed through said opening; and said outwardly sloping walls extend at a second slope to establish a second applied force after the interior surfaces make contact and while said legs are deflecting toward each other in said area between said base and shoulder as said feet continue to be pushed through said opening.

7. A retainer in accordance with claim 6 wherein said second slope comprises an angle in a range of about 6° to 12° with respect to a longitudinal axis of said retainer.

8. A retainer in accordance with claim 7 wherein said first slope comprises an angle in a range of about 12° to 20° with respect to said longitudinal axis.

9. A retainer in accordance with claim 5 wherein each of said legs has a deformable rib running longitudinally along the interior surface thereof.

10. A retainer in accordance with claim 9 wherein said ribs are aligned with each other for engagement when said legs are compressed.

11. A retainer in accordance with claim 5 wherein the crushing of said rib is permanent.

12. A retainer in accordance with claim 5 wherein the distance from said shoulder to said point is approximately equal to the distance from said base to said shoulder.

13. A retainer in accordance with claim 5 wherein:

said outwardly sloping walls extend at a first slope commencing at said point to facilitate the initial insertion of said retainer into said opening;

said outwardly sloping walls extend at a second slope following and different than said first slope to establish a first applied force prior to a time at which said interior surfaces of said legs make contact as said feet are pushed through said opening; and said outwardly sloping walls extend at a third slope following and different than said second slope to establish a second applied force after the interior surfaces make contact and while said legs are deflecting toward each other in said area between said base and shoulder as said feet continue to be pushed through said opening.

14. A resilient snap fitting retainer for insertion into an opening, comprising:

a pair of generally parallel resilient legs extending from a base, each leg having an interior surface facing the interior surface of the other leg with a gap therebetween to allow compression of the legs toward each other;

each of said legs terminates at a distal end thereof in a wedge shaped foot, said feet together forming a generally arrowhead-like shape bifurcated by said gap and having a point at one end thereof and a shoulder at the opposite end thereof, said point and shoulder being connected by walls sloping outwardly relative to a longitudinal axis of said retainer from said point to said shoulder and adapted for insertion point first through said opening, said shoulder being arranged to snap over said opening when pushed therebeyond to retain said retainer in said opening;

each of said legs has an exterior surface which extends substantially parallel to said longitudinal axis in a region between said base and said shoulder;

said feet and legs are constructed and arranged to enable said legs to bend toward each other in an area between said base and said shoulder after the interior surfaces of said legs have made contact at their distal ends as said feet are pushed through said opening;

said gap extends continuously from said base to said distal end of said legs and across a width of said interior surfaces;

said outwardly sloping walls extend at a first slope commencing at said point to facilitate the initial insertion of said retainer into said opening;

said outwardly sloping walls extend at a second slope following and different than said first slope to establish a first applied force prior to a time at which said interior surfaces of said legs make contact as said feet are pushed through said opening;

said outwardly sloping walls extend at a third slope following and different than said second slope to establish a second applied force after the interior surfaces make contact and while said legs are deflecting toward each other in said area between said base and shoulder as said feet continue to be pushed through said opening.

15. A retainer in accordance with claim 14 wherein said second slope comprises an angle in a range of about 8° to 12° with respect to said longitudinal axis.

16. A retainer in accordance with claim 15 wherein said first slope comprises an angle in a range of about 12° to 20° with respect to said longitudinal axis.

17. A retainer in accordance with claim 14 wherein the distance from said shoulder to said point is approximately equal to the distance from said base to said shoulder.

18. A retainer in accordance with claim 14 wherein the distance from said shoulder to said point is approximately equal to the distance from said base to said shoulder.

* * * * *